(12) United States Patent
Kono

(10) Patent No.: US 6,570,812 B2
(45) Date of Patent: May 27, 2003

(54) SEMICONDUCTOR MEMORY DEVICE WITH IMPROVED SETUP TIME AND HOLD TIME

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/906,668

(22) Filed: Jul. 18, 2001

(65) Prior Publication Data

US 2002/0110041 A1 Aug. 15, 2002

(30) Foreign Application Priority Data

Feb. 13, 2001 (JP) ........................................ 2001-034857

(51) Int. Cl.[7] ................................................ G11C 8/00
(52) U.S. Cl. .............................. 365/230.08; 365/230.03; 365/233
(58) Field of Search ........................ 365/230.08, 230.03, 365/233

(56) References Cited

U.S. PATENT DOCUMENTS

| | | | | |
|---|---|---|---|---|
| 5,966,316 A | * | 10/1999 | Tsukikawa | ............. 365/230.03 |
| 6,064,621 A | * | 5/2000 | Tanizaki et al. | ........ 365/189.09 |
| 6,331,956 B1 | * | 12/2001 | Ooishi et al. | ................ 365/200 |
| 6,335,875 B2 | * | 1/2002 | Ooishi | .................... 365/230.03 |

OTHER PUBLICATIONS

U.S. Related application No. 09/110,688, filed Jul. 7, 1998 (Our Ref. No. 49657–097).
U.S. Related application No. 08/627,313, filed Apr. 3, 1996 (Our Ref. No. 50429–355).

* cited by examiner

Primary Examiner—David Nelms
Assistant Examiner—Ly Duy Pham
(74) Attorney, Agent, or Firm—McDermott, Will & Emery

(57) ABSTRACT

In the case where memory arrays are arranged so as to surround the central region where peripheral circuitry and pads are provided, arranging pads for receiving addresses A0 to A12, BA1 and BA0 in two trains is facilitated. By locating an address latch circuit at an equal distance from each pad train, characteristics of the setup time and hold time can be improved.

16 Claims, 12 Drawing Sheets

SEMICONDUCTOR MEMORY DEVICE WITH IMPROVED SETUP TIME AND HOLD TIME

BACKGROUND OF THE INVENTION

1. Field of the Invention

The present invention generally relates to a semiconductor memory device. More particularly, the present invention relates to a semiconductor memory device for introducing therein an address signal in synchronization with an external clock.

2. Description of the Background Art

FIG. 13 is a timing chart showing the relation between an external clock ext.CLK and an external address ext.Add that are input to a conventional synchronous dynamic random access memory (SDRAM).

Referring to FIG. 13, the timing of introducing the external address ext.Add is defined with respect to the rising edge of the external clock ext.CLK. In FIG. 13, tIS indicates setup time, and tIH indicates hold time.

The input address passes through an input buffer including a comparator and the like, which is located at a first input stage. In the input buffer, the input address is converted into a signal INTA having an appropriate internal level. The signal INTA is latched for a fixed period in an address latch. A trigger signal of the address latch is an internal clock ZCLKF produced from the clock ext.CLK. Although depending also on the circuit characteristics of the address latch, the setup time tIS and hold time tIH are determined mainly according to the propagation characteristics of the signal INTA and internal clock ZCLKF.

The propagation characteristics of these signals depend on the distance from an address pad and a clock pad to the address latch. Accordingly, the position of the address latch within the chip is important.

FIG. 14 is a diagram illustrating the pad arrangement and memory-array arrangement of a conventional general SDRAM.

Referring to FIG. 14, the SDRAM 500 includes memory banks A to D. The memory banks A to D are arranged in two rows by two columns. Each memory bank has a row decoder RD located in the center thereof, and column decoder bands CPW located on both sides of the row decoder RD so as to correspond to respective memory arrays. More specifically, the bank A includes memory arrays 501 and 502. The bank B includes memory arrays 503 and 504. The bank C includes memory arrays 505 and 506. The bank D includes memory arrays 507 and 508.

The SDRAM 500 has a central region extending along the line connecting the respective middle points of the shorter sides of the chip. The SDRAM 500 includes an address pad train 514, a control-signal pad train 516, and a DQ pad train 518 in the central region.

The DQ pad 518 is located between the banks A and B. The address pad train 514 and control-signal pad train 516 are located between the banks C and D.

A first input stage 512 is provided corresponding to the pads receiving an input signal out of pads 510 of these pad trains. The pads of the address pad train 514 correspond to an address signal on a bit-by-bit basis. More specifically, the pads of the address pad train 514 respectively correspond to address signals A4, A3, A5, A2, A6, A1, A7, A0, A8, A10, A9, BA1, A11, BA0, A12 sequentially from its end. The address thus input from the address pad train 514 passes through the first input stage 512, and is input to an address latch circuit 538 as a signal INTA.

The control-signal pad train 516 includes a pad for receiving a clock signal CLK. The clock CLK is input through a first input stage to the address latch circuit 538 as an internal clock ZCLKF.

FIG. 15 is a diagram showing the structure of the address latch circuit 538 of FIG. 14.

Referring to FIG. 15, the address latch circuit 538 includes address latches 538.0 to 538.14 respectively corresponding to the bits of the address signal. More specifically, the address latches 538.0 to 538.12 receive address signals INTA_A0 to INTA_A12, and output signals ADD<0> to ADD<12>, respectively. The address latches 538.13 and 538.14 receive address signals INTA_BA0 and INTA_BA1, and output signals BADD<0> and BADD<1>, respectively.

The address latch circuit 538 further includes an inverter 540 for receiving the internal clock signal ZCLKF and generating a clock signal CLKA serving as a reference for introducing the internal address signal INTA to each address latch. The inverter 540 drives an internal node having a plurality of clock input nodes of the address latches connected thereto and thus having large load capacitance.

FIG. 16 is a circuit diagram showing the structure of the address latch 538.0 in FIG. 15.

Referring to FIG. 16, the address latch 538.0 includes an inverter 552 for receiving and inverting the clock signal CLKA, an inverter 554 for receiving and inverting the signal INTA, and P-channel MOS transistors 556, 558 and N-channel MOS transistors 560, 562 connected in series between the power supply potential and the ground potential. The P-channel MOS transistors 556 and 558 receive the output of the inverter 554 and the clock signal CLKA at their gates, respectively. The N-channel MOS transistors 560 and 562 receive the outputs of the inverters 552 and 554 at their gates, respectively.

The address latch 538.0 further includes inverters 564, 568 having their inputs connected to the drain of the N-channel MOS transistor 560, a clocked inverter 570 for receiving the output of the inverter 568 for feedback to the input of the inverter 568, and an inverter 566 for receiving the output of the inverter 564 and outputting the signal ADD. The clocked inverter 570 is activated in response to activation of the clock signal CLKA.

Referring back to FIG. 14, the address pad train 514 is arranged in line, and therefore has a long train length. Provided that all address latches are collectively located at a single location as in the address latch circuit 538, the length of a path from the first input stage to the address latch circuit 538, i.e., a transmission path of the signal INTA, is significantly different from address bit to address bit, resulting in variation in setup time and hold time among the address bits.

Note that it is also possible to arrange the address latches separately on a pad-by-pad basis. In this case, however, the propagation time of the internal clock signal ZCLKF becomes different from address bit to address bit, also resulting in variation in setup time and hold time among the address bits.

In order to solve these problems in principle, it is primarily important to reduce the length of the address pad train. One possible method thereof is to arrange the address pads in two or more trains.

However, in the general structure of FIG. 14 in which the memory banks are arranged in two rows by two columns, arranging the address pads in two trains increases the width of the peripheral circuit band extending along the line connecting the respective middle points of the shorter sides of the chip, thereby significantly increasing the length of the shorter side of the chip. As a result, the number of chips obtained per wafer is significantly reduced, resulting in increased costs of the semiconductor memory device. Therefore, arranging the address pads in multiple trains has been substantially impossible at least in a chip in which the memory banks are arranged in two rows by two columns, i.e., a chip for mass production.

Conventionally, dynamic random access memories (DRAMs) including synchronous dynamic random access memories (SDRAMs) generally have a $2^n$-bit storage capacity. In order to realize this capacity, the memory arrays or banks of the DRAM are generally arranged in two by two, i.e., two rows by two columns.

Developing a new DRAM with a fourfold memory capacity in a 3-year cycle is a conventional trend. However, it is becoming technically difficult to improve the memory capacity as such. In the meantime, with expansion of the information and communication industry such as widespread use of the Internet, there is an active demand on the market for the improved memory capacity. In such circumstances, a DRAM having a $2^{(2n+1)}$-bit capacity has also been developed against the conventional trend. Such a DRAM may have an irregular memory-array arrangement instead of the conventional mainstream, i.e., the arrangement in two rows by two columns.

For example, a DRAM with a 512-Mbit capacity may have memory arrays arranged in regions of three rows by three columns. The central region of the second row, second column is a region where peripheral circuitry and pads are provided, and the memory arrays are arranged so as to surround the peripheral-circuit region located in the center. In this case, because of a large width of the peripheral-circuit region, arranging the pads in multiple trains does not affect the length of the shorter side of the chip.

There have been examples in which the pads are arranged in two trains in the peripheral-circuit region. However, the address-latch arrangement for suppressing variation in setup time and hold time among the address bits has not specifically been discussed. A method for improving the characteristics of the setup time and hold time, and distribution of latched signals have not been studied.

In addition to the example in which the memory banks are arranged in two rows by two columns, there have been examples for improving the propagation characteristics of the signals entering the address latches. In these examples, a plurality of signals INTA are prevented from becoming adjacent to each other so as not to interfere with each other, the buffer size of the signal INTA is made different from address to address, and the like. However, the delay time resulting from parasitic resistance and parasitic capacitance of the interconnection is different from address to address, necessitating generation of the difference in arrival time to the address latch.

SUMMARY OF THE INVENTION

It is an object of the present invention to improve, in a semiconductor memory device operating in synchronization with an external clock, the characteristics of the setup time and hold time by optimizing the arrangement of address latches particularly in the case where memory arrays are arranged so as to surround the central region of the chip where peripheral circuitry is provided.

In summary, according to the present invention, a semiconductor memory device formed in a memory region of a main surface of a semiconductor substrate includes a plurality of terminal groups, a clock terminal, an address latch circuit, and a plurality of memory blocks.

The plurality of terminal groups are each located collectively in a central region of the memory region, and receive respective allocated bits of an external address signal. The clock terminal is provided in the central region, and receives an external clock signal. The address latch circuit is provided in the central region at a substantially equal distance from the plurality of terminal groups, and latches the address signal according to the clock signal. The plurality of memory blocks are provided in a peripheral region surrounding the central region in the memory region, and receive and output data according to an output of the address latch circuit.

According to another aspect of the present invention, a semiconductor memory device formed in a memory region of a main surface of a semiconductor substrate includes a plurality of terminal groups, a clock terminal, a plurality of address latch circuits, and a plurality of memory blocks.

The plurality of terminal groups are each located collectively in a central region of the memory region, and receive respective allocated bits of an external address signal. The clock terminal is provided in the central region, and receives an external clock signal. The plurality of address latch circuits are each provided in the central region at a substantially equal distance from the plurality of terminal groups, and latch the address signal according to the clock signal. The plurality of memory blocks are provided in a peripheral region surrounding the central region in the memory region, and receive and output data according to respective outputs of the plurality of address latch circuits.

According to a further aspect of the present invention, a semiconductor memory device includes a plurality of terminals, an address latch circuit, a plurality of memory blocks, and a plurality of interconnections.

The plurality of terminals receive respective allocated bits of an external address signal. The address latch circuit latches the address signal. The plurality of memory blocks receive and output data according to an output of the address latch circuit. The plurality of interconnections are respectively provided on a plurality of paths for transmitting the respective address bits from the plurality of terminals to the address latch circuit. Each of the plurality of interconnections has its width and its distance to an adjacent interconnection determined according to a path length from the corresponding terminal to the address latch circuit.

Accordingly, a primary advantage of the present invention is that respective path lengths from terminals receiving an address to an address latch circuit can be averaged, and variation in setup time and hold time can be reduced.

Another advantage of the present invention is that the variation in setup time and hold time can further be reduced according to the respective path lengths from the terminals to the address latch circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
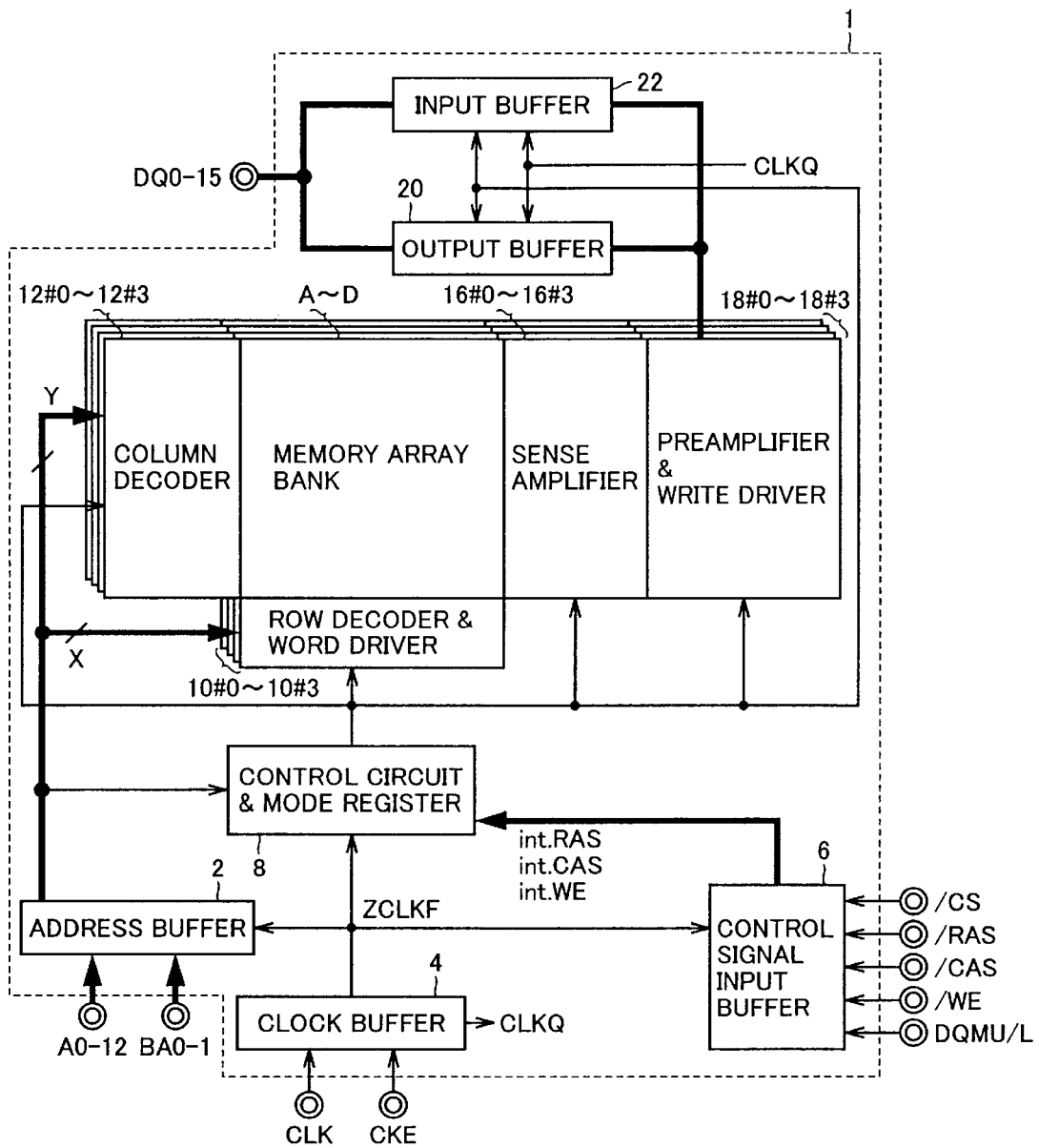
FIG. 1 is a schematic block diagram showing the structure of a semiconductor memory device 1 according to an embodiment of the present invention.

Hereinafter, embodiments of the present invention will be described in detail with reference to the accompanying drawings. Note that the same reference numerals and characters denote the same or corresponding portions throughout the figures.

First Embodiment

FIG. 1 is a schematic block diagram showing the structure of a semiconductor memory device 1 according to an embodiment of the present invention.

Referring to FIG. 1, the semiconductor memory device 1 includes memory array banks A to D each having a plurality of memory cells arranged in a matrix, an address buffer 2 for introducing therein external address signals A0 to A12 and external bank address signals BA0 and BA1 in synchronization with a clock signal ZCLKF and outputting an internal row address, an internal column address and an internal bank address, a clock buffer 4 for receiving an external clock signal CLK and an external clock enable signal CKE and outputting clock signals ZCLKF and CLKQ for use within the semiconductor memory device, and a control signal input buffer 6 for introducing therein external control signals /CS, /RAS, /CAS and/WE and an external data mask signal DQMU/L in synchronization with the clock signal ZCLKF.

The semiconductor memory device 1 further includes a control circuit for receiving internal address signals int.A0 to int.A12 and internal bank address signals int.BA0 and int.BA1 from the address buffer 2 and also receiving from the control signal input buffer 6 control signals int.RAS, int.CAS and int.WE synchronized with the clock signal, and outputting a control signal to each block in synchronization with the clock signal ZCLKF, and a mode register for retaining the operation mode recognized in the control circuit. In FIG. 1, the control circuit and the mode register are collectively shown as a single block 8.

The control circuit includes a bank address decoder for decoding the internal bank address signals int.BA0 and int.BA1, and a command decoder for receiving the control signals int.RAS, int.CAS and int.WE for decoding.

The semiconductor memory device 1 further includes row decoders provided corresponding to the respective memory array banks A to D, for decoding a row address signal X applied from the address buffer 2, and word drivers provided corresponding to the respective memory array banks A to D, for driving an addressed row (word line) within the corresponding memory array bank A to D to the selected state according to an output signal of the corresponding row decoder. In FIG. 1, the row decoders and the word drivers are collectively shown as blocks 10#0 to 10#3.

The semiconductor memory device 1 further includes column decoders 12#0 to 12#3 for decoding an internal column address signal Y applied from the address buffer 2 to generate a column selection signal, and sense amplifiers 16#0 to 16#3 for sensing and amplifying the data in a memory cell connected to the selected row of the corresponding memory array bank A to D.

The semiconductor memory device 1 further includes an input buffer 22 for receiving external write data and producing internal write data, write drivers for amplifying the internal write data from the input buffer 22 for transmission to a selected memory cell, preamplifiers for amplifying the data read from the selected memory cell, and an output buffer 20 for buffering the data from the preamplifier for output to the outside.

The preamplifiers and the write drivers are provided respectively corresponding to the memory array banks A to D. In FIG. 1, the preamplifiers and the write drivers are collectively shown as blocks 18#0 to 18#3.

Note that the input buffer 22 and the output buffer 20 receive a clock signal CLKQ from the clock buffer 4, and receive and output the data from and to the outside through data input/output (I/O) terminals DQ0 to DQ15 in synchronization with the clock signal CLKQ.

Figure 2:
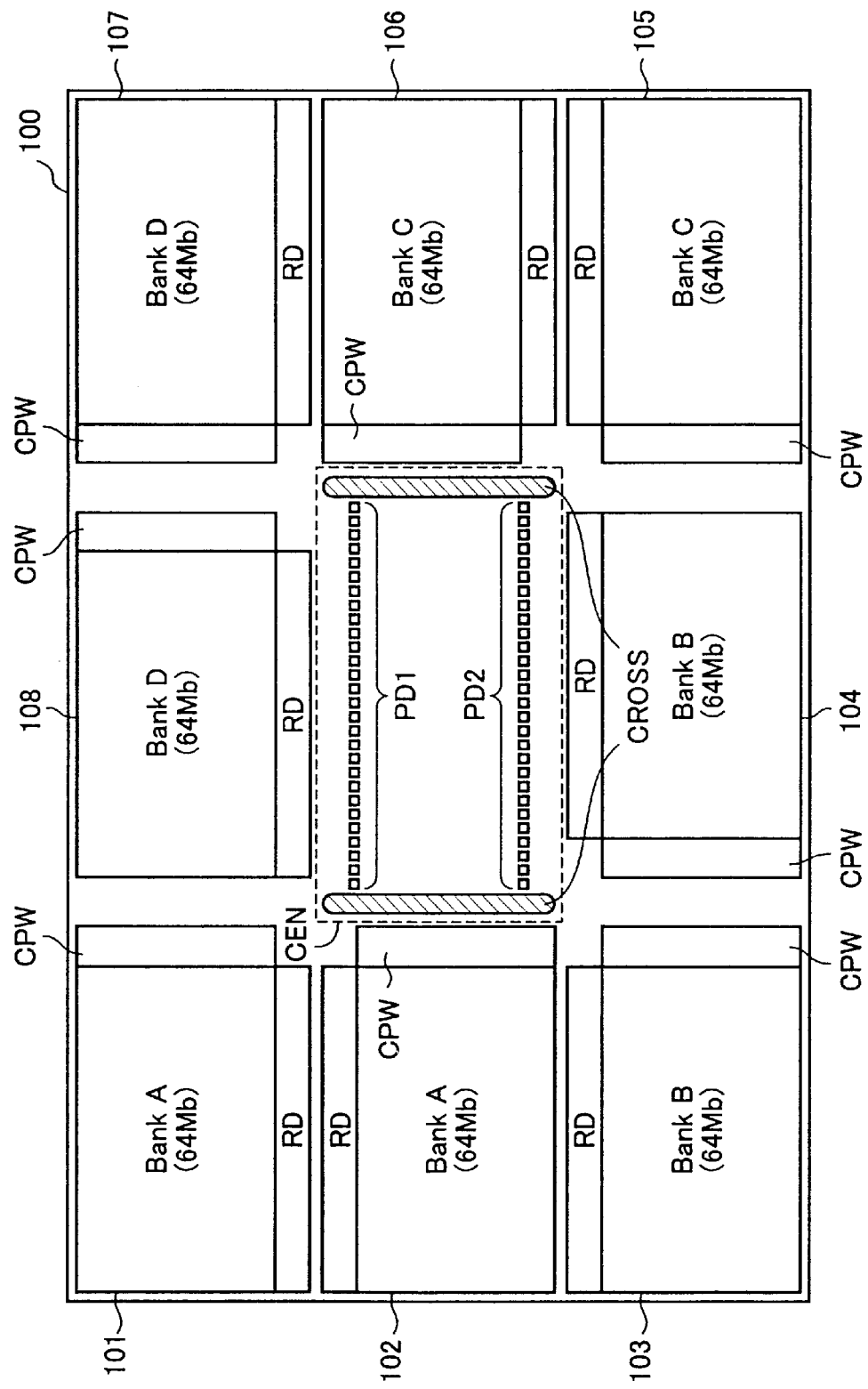
FIG. 2 is a diagram illustrating the arrangement of components such as memory arrays in a semiconductor memory device according to a first embodiment.

FIG. 2 is a diagram illustrating the arrangement of components such as the memory arrays in a semiconductor memory device of the first embodiment.

Referring to FIG. 2, the semiconductor memory device 100 is divided into regions of three rows by three columns. Herein, an irregular memory-array arrangement is employed in which memory arrays 101 to 108 are arranged so as to surround the central region CEN of the second row, second column.

The semiconductor memory device 100 includes four banks A to D.

The bank A includes memory arrays 101, 102, and the bank B includes memory arrays 103, 104. The bank C includes memory arrays 105, 106, and the bank D includes memory arrays 107, 108. Each of the memory arrays 101 to 108 has a 64-Mbit capacity, and each bank has a 128-Mbit capacity.

Due to the shape of a memory cell unit, each memory array having a plurality of memory cells arranged in a matrix has a rectangular shape, wherein the longer side thereof is about 2L, provided that the shorter side is L. A column decoder band CPW is provided along one of the shorter sides of each memory array. Each column decoder band CPW includes preamplifiers and write drivers in addition to column decoders. A row decoder band RD is provided along one of the longer sides of each memory array.

The memory arrays 101, 108 and 107 are respectively located in the regions of the first row, first column, the first row, second column, and the first row, third column. The memory arrays 102 and 106 are respectively located in the regions of the second row, first column, and the second row, third column. The memory arrays 103, 104 and 105 are respectively located in the regions of the third row, first column, the third row, second column, and the third row, third column.

The column decoder band CPW corresponding to the memory array 101 is provided along the shorter side of the memory array 101 that is located closer to the region of the first row, second column. The row decoder band RD corresponding to the memory array 101 is provided along the longer side of the memory array 101 that is located closer to the region of the second row, first column.

The column decoder band CPW corresponding to the memory array 108 is provided along the shorter side of the memory array 108 that is located closer to the region of the first row, third column. The row decoder band RD corresponding to the memory array 108 is provided along the longer side of the memory array 108 that is located closer to the region of the second row, second column.

The column decoder band CPW corresponding to the memory array 107 is provided along the shorter side of the memory array 107 that is located closer to the region of the first row, second column. The row decoder band RD corresponding to the memory array 107 is provided along the longer side of the memory array 107 that is located closer to the region of the second row, third column.

The column decoder band CPW corresponding to the memory array 102 is provided along the shorter side of the memory array 102 that is located closer to the region of the second row, second column. The row decoder band RD corresponding to the memory array 102 is provided along the longer side of the memory array 102 that is located closer to the region of the first row, first column.

The column decoder band CPW corresponding to the memory array 106 is provided along the shorter side of the memory array 106 that is located closer to the region of the second row, second column. The row decoder band RD corresponding to the memory array 106 is provided along the longer side of the memory array 106 that is located closer to the region of the third row, third column.

The column decoder band CPW corresponding to the memory array 103 is provided along the shorter side of the memory array 103 that is located closer to the region of the third row, second column. The row decoder band RD corresponding to the memory array 103 is provided along the longer side of the memory array 103 that is located closer to the region of the second row, first column.

The column decoder band CPW corresponding to the memory array 104 is provided along the shorter side of the memory array 104 that is located closer to the region of the third row, first column. The row decoder band RD corresponding to the memory array 104 is provided along the longer side of the memory array 104 that is located closer to the region of the second row, second column.

The column decoder band CPW corresponding to the memory array 105 is provided along the shorter side of the memory array 105 that is located closer to the region of the third row, second column. The row decoder band RD corresponding to the memory array 105 is provided along the longer side of the memory array 105 that is located closer to the region of the second row, third column.

Pad trains PD1 and PD2 are provided in the central region CEN along the longer side thereof. Circuitry for generating a control signal is provided in a region CROSS extending along each shorter side of the central region.

Figure 3:
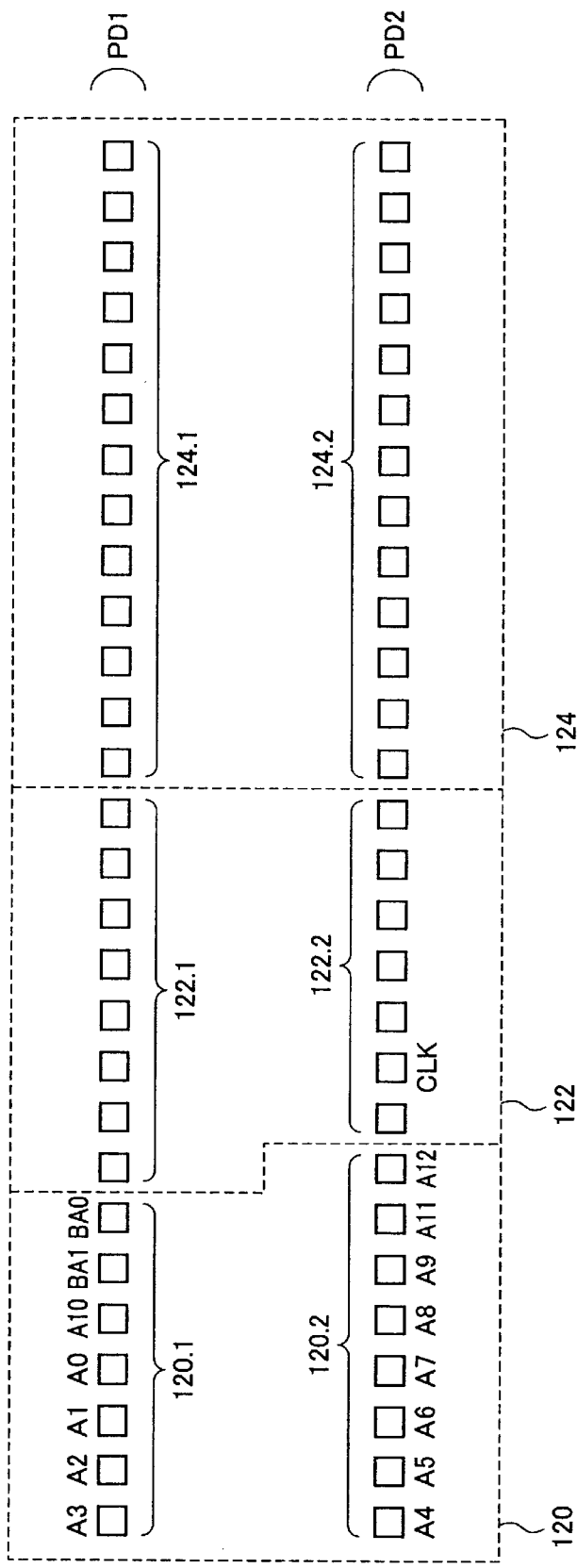
FIG. 3 is a diagram showing in further detail the arrangement of pad trains PD1 and PD2 in FIG. 2.

FIG. 3 is a diagram showing in further detail the arrangement of the pad trains PD1 and PD2 in FIG. 2.

Referring to FIG. 3, an address pad group 120 includes a pad train 120.1 forming a part of the pad train PD1 and a pad train 120.2 forming a part of the pad train PD2. The pad train 120.1 includes pads for receiving respective address bits A3, A2, A1, A0, A10, BA1 and BA0 sequentially from the end of the pad train PD1. The pad train 120.2 includes pads for receiving respective address bits A4, A5, A6, A7, A8, A9, A11 and A12 sequentially from the end of the pad train PD2.

A control signal pad group 122 includes a pad train 122.1 forming a part of the pad train PD1 and a pad train 122.2 forming a part of the pad train PD2. Note that the pad train 122.2 includes a pad for receiving the clock signal CLK.

A DQ pad group 124 includes a pad train 124.1 forming a part of the pad train PD1 and a pad train 124.2 forming a part of the pad train PD2.

Figure 4:
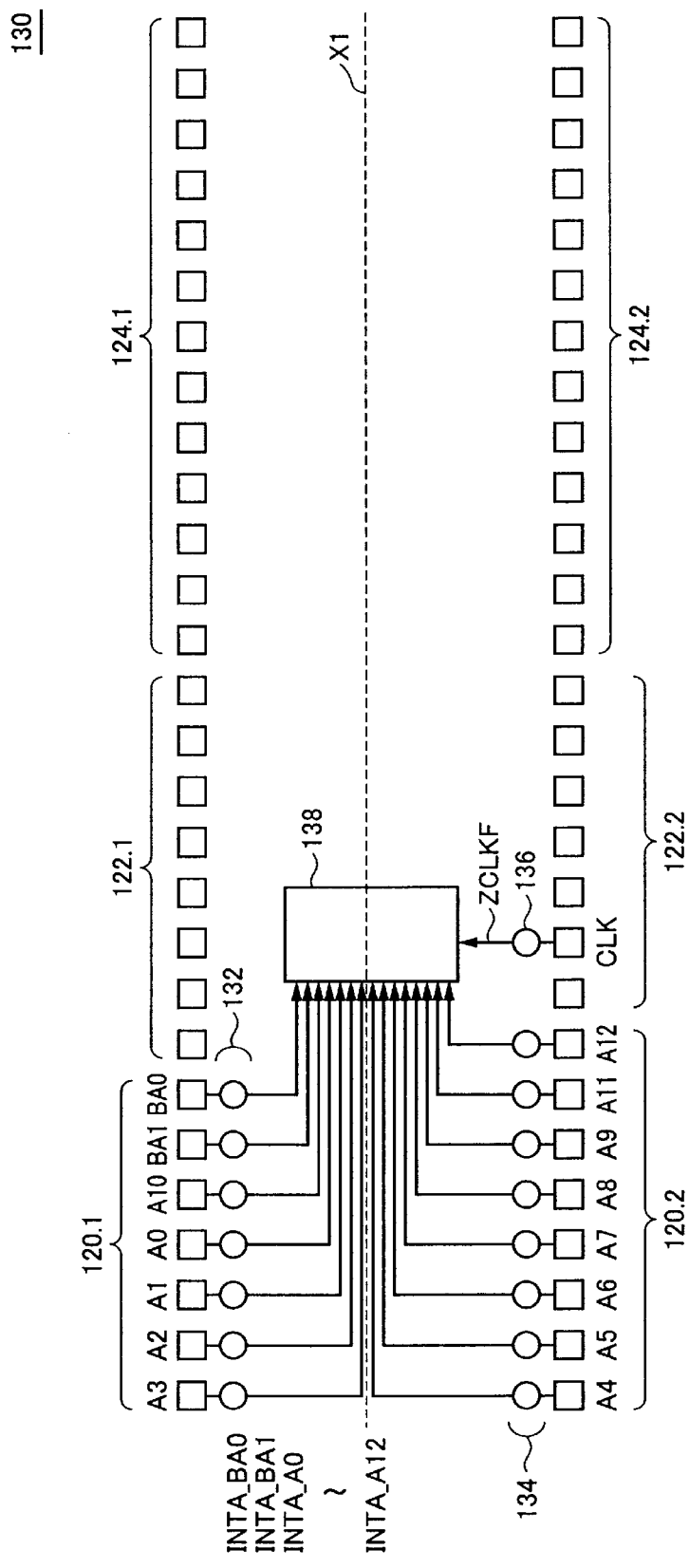
FIG. 4 is a diagram illustrating an arrangement example 130 of an address latch circuit 138 in the first embodiment.

FIG. 4 is a diagram illustrating an arrangement example 130 of an address latch circuit 138 in the first embodiment.

Referring to FIG. 4, in the arrangement example 130, the pad for receiving the clock signal CLK is located approximately in the center of the chip. This is because the pad for receiving the clock signal CLK is located near the center of the chip as long as the standardized pin arrangement is applied. First input stages 132 and 134 are provided near the respective address pads. The first input stages 132 and 134 include an input buffer for changing the input level to an appropriate level by a comparator or the like for transmission to the inside.

The address latch circuit 138 is located on the line X1 that is in parallel with, and located at an equal distance from, the first and second pad trains.

Ideally, it is desirable that the center of the address latch circuit 138 is located on the line X1. However, arranging the address latch circuit 138 such that the line X1 extends across at least a part of the region of the address latch circuit 138 would be effective in averaging the respective lengths of the address transmission paths.

This reduces variation in length of the interconnections for transmitting the signal INTA from the first input stage 132 to the address latch circuit 138 and in length of the interconnections for transmitting the signal from the first input stage 134 to the address latch circuit 138. The address latch circuit 138 is arranged on the line X1 so as to have the shortest distance to both the pad for receiving the clock signal and a first input stage 136 provided near the pad. This reduces the propagation time of the clock signal ZCLKF to address latches that are collectively located within the address latch circuit 138.

Figure 5:
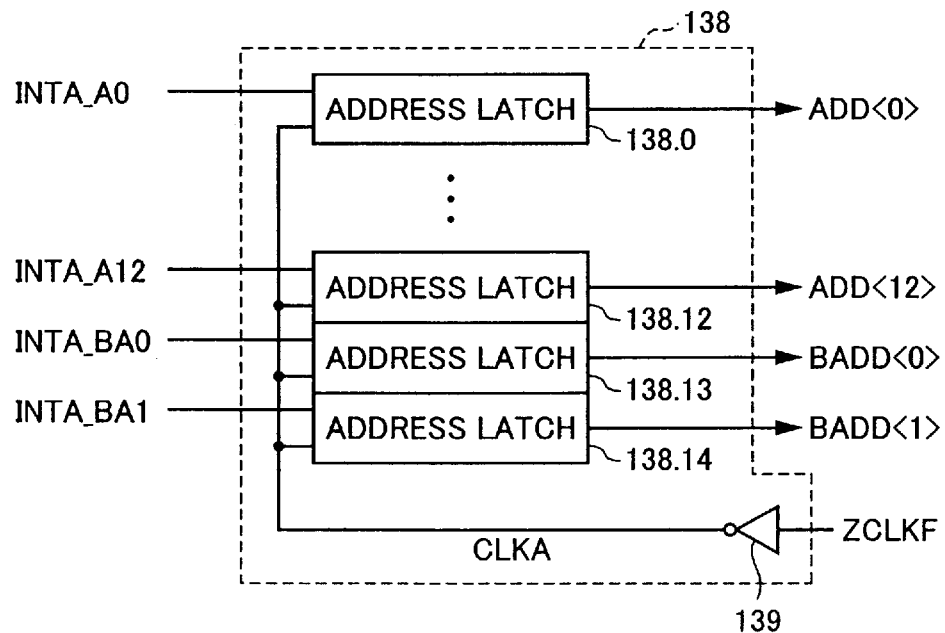
FIG. 5 is a block diagram showing the structure of the address latch circuit 138 in FIG. 4.

FIG. 5 is a block diagram showing the structure of the address latch circuit 138 in FIG. 4.

Referring to FIG. 5, the address latch circuit 138 includes address latches 138.0 to 138.14 respectively corresponding to the bits of the address signal. More specifically, the address latches 138.0 to 138.12 receive address signals INTA_A0 to INTA_A12, and output signals ADD<0> to ADD<12>, respectively. The address latches 138.13 and 138.14 receive address signals INTA_BA0 and INTA_BA1, and output signals BADD<0> and BADD<1>, respectively.

The address latch circuit 138 further includes an inverter 139 for receiving the internal clock signal ZCLKF and generating a clock signal CLKA serving as a reference for introducing the internal address signal INTA to each address latch. The inverter 139 drives an internal node having a plurality of clock input nodes of the address latches connected thereto and thus having large load capacitance.

Figure 6:
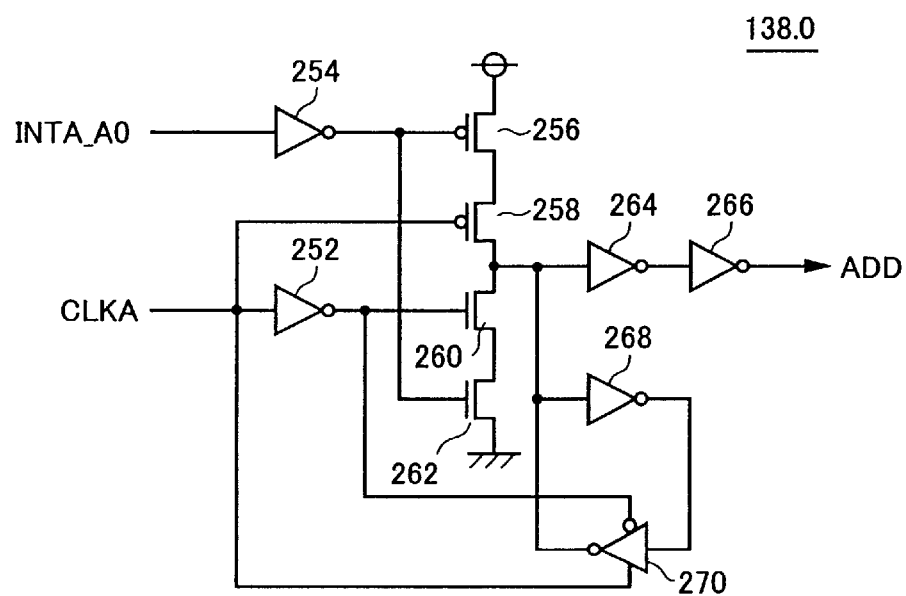
FIG. 6 is a circuit diagram showing the structure of an address latch 138.0 in FIG. 5.

FIG. 6 is a circuit diagram showing the structure of the address latch 138.0 in FIG. 5.

Referring to FIG. 6, the address latch 138.0 includes an inverter 252 for receiving and inverting the clock signal CLKA, an inverter 254 for receiving and inverting the signal INTA_A0, and P-channel MOS transistors 256, 258 and N-channel MOS transistors 260, 262 connected in series between the power supply potential and the ground potential. The P-channel MOS transistors 256 and 258 receive the output of the inverter 254 and the clock signal CLKA at their gates, respectively. The N-channel MOS transistors 260 and 262 receive the outputs of the inverters 252 and 254 at their gates, respectively.

The address latch 138.0 further includes inverters 264, 268 having their inputs connected to the drain of the N-channel MOS transistor 260, a clocked inverter 270 for receiving the output of the inverter 268 for feedback to the input of the inverter 268, and an inverter 266 for receiving the output of the inverter 264 and outputting the signal ADD. The clocked inverter 270 is activated in response to activation of the clock signal CLKA.

Figure 7:
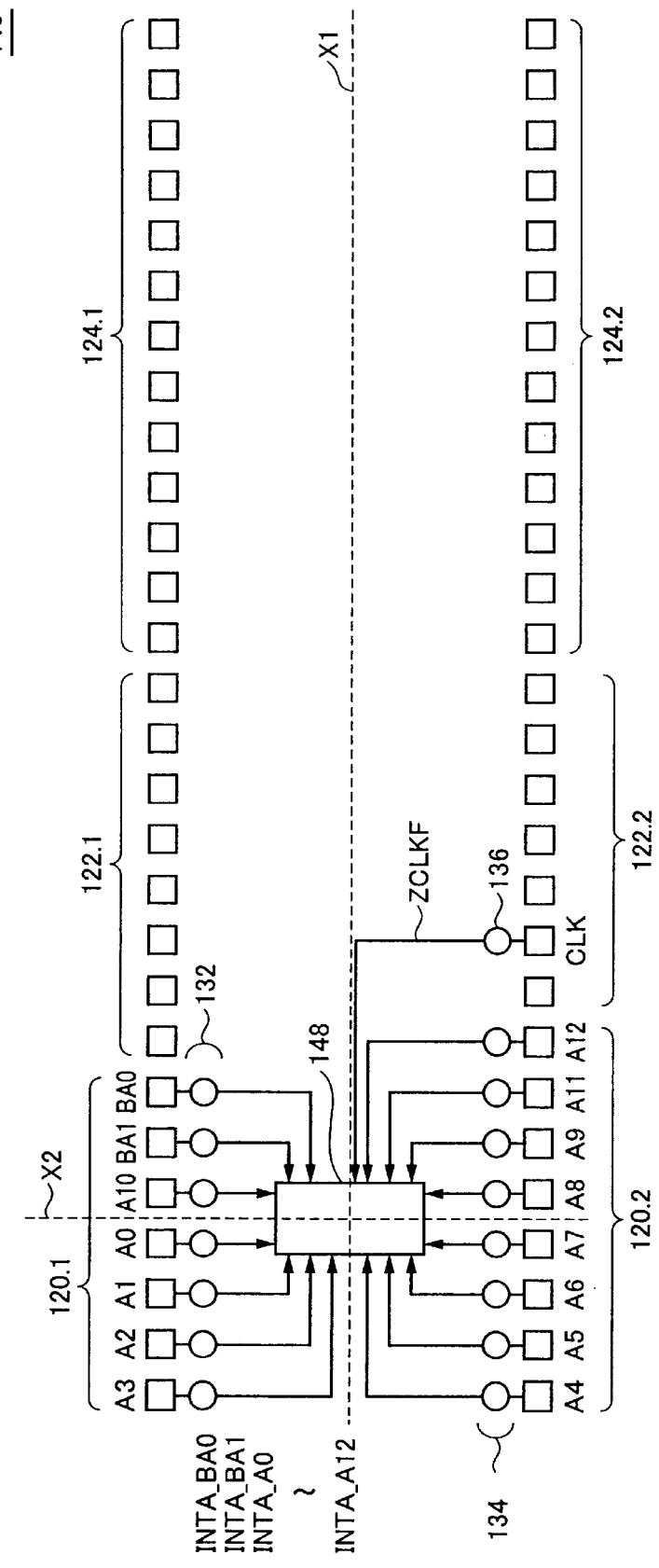
FIG. 7 is a diagram illustrating a second arrangement example 140 of an address latch circuit.

FIG. 7 is a diagram illustrating a second arrangement example 140 of the address latch circuit.

Referring to FIG. 7, the arrangement example 140 is the same as that of FIG. 4 in that the address latch circuit 148 is arranged on the line X1 that is located at an equal distance from the pad trains 120.1 and 120.2, but is different therefrom in that the address latch circuit 148 is arranged also on the line X2 extending perpendicularly to the line X1 through the middle point of the pad train 120.2 included in the address pad group.

Arranging the address latch circuit 148 on the line X2 reduce the difference between the respective lengths of a plurality of input signal paths from the pad group 120.2 to the address latch circuit 148. Note that the respective lengths of a plurality of input signal paths from the pad group 120.1 to the address latch circuit 148 can also be averaged in the same manner as that of the paths from the pad group 120.2.

Since the difference in transmission interconnection length of the signal INTA between addresses can be reduced, variation in setup time and hold time can further be reduced as compared to the arrangement example 130 shown in FIG. 4. Moreover, since the difference between the interconnection length for transmitting the clock signal ZCLKF and the average interconnection length for transmitting the signal INTA is small, the number of delay elements for adjusting the setup time and hold time can be reduced.

In either one of the arrangement examples 130 and 140 shown in FIGS. 4 and 7, the clock signal ZCLKF has a blunt waveform. This is because the driving load with the signal ZCLKF is large due to large interconnection parasitic capacitance and gate capacitance receiving the signal ZCLKF. In order to prevent degradation in latch characteristics, the clock signal ZCLKF is buffered near the plurality of address latches through the inverter or the like as shown in FIG. 5, whereby blunting of the waveform of the clock signal entering the address latches is suppressed.

As has been described above, by locating the address latch circuit at an equal distance from each pad train, variation in setup time and hold time between the pad trains can be reduced. The position of the address latch circuit may be shifted from the position near the address pad region to the position near the clock pad region, as required. This allows for further reduced variation in setup time and hold time.

Second Embodiment

In the first embodiment, the address latches are collectively located at an equal distance from both pad trains in order to suppress variation in setup time and hold time between the pad trains. It should be noted that the address latches need not be located at a single location.

Figure 8:
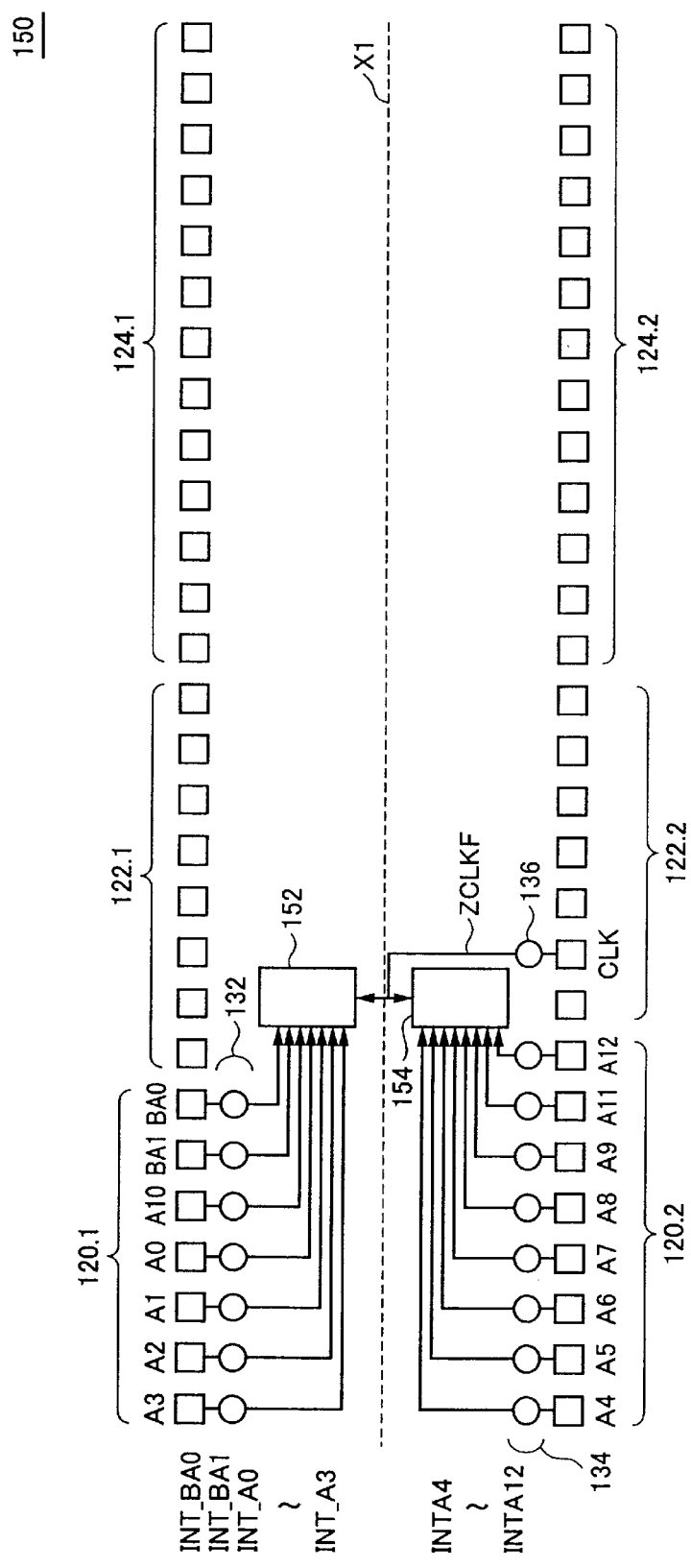
FIG. 8 is a diagram illustrating an arrangement example 150 of an address latch circuit of a second embodiment.

FIG. 8 is a diagram showing an arrangement example 150 of an address latch circuit according to the second embodiment.

Referring to FIG. 8, in the arrangement example 150, the address latch circuit is divided into an address latch circuit 152 corresponding to an address pad train 120.1 and an address latch circuit 154 corresponding to an address pad train 120.2.

In this arrangement, a path for transmitting an address bit A3 from a corresponding pad to the address latch circuit 152 through a first input stage 132 has the same length as that of a path for transmitting an address bit A4 from a corresponding pad to the address latch circuit 154 through a first input stage 134. Moreover, these paths are mirror-symmetric with respect to the line X1 extending halfway between, and in parallel with, both pad trains.

Similarly, the respective transmission paths of address bits A2, A1, A0, A10, BA1 and BA0 are mirror-symmetric to the respective transmission paths of address bits A5, A6, A7, A8, A9 and A11 with respect to the line X1. The respective transmission paths of the clock signal CLK to the address latch circuits 152 and 154 are made to have the same length. In other words, the clock signal CLK is first transmitted through a corresponding pad and a first input stage 136 to a point on the line X1 that is located at an equal distance from the address latch circuits 152 and 154. From that point, the path is branched to the address latch circuits 152 and 154.

Note that, since each of the address latch circuits 152 and 154 has the same structure as that shown in FIG. 5, description thereof will not be repeated. In each of the address latch circuits 152 and 154, however, the number of address bits and the number of corresponding latch circuits are both reduced by half. An inverter for amplifying a clock near the latch circuits is included in each of the address latch circuits 152 and 154.

Figure 9:
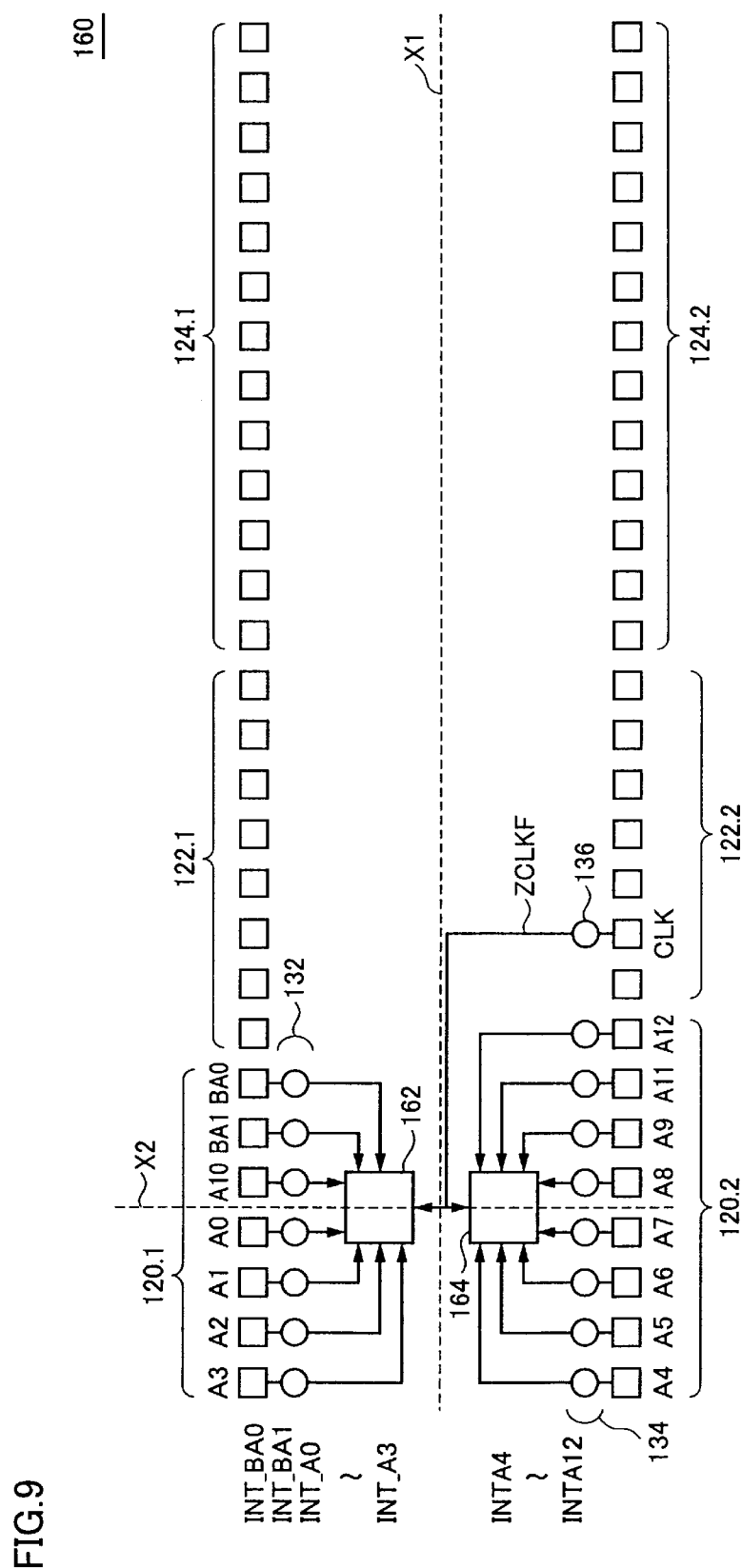
FIG. 9 is a diagram illustrating a second arrangement example 160 of the second embodiment.

FIG. 9 is a diagram illustrating a second arrangement example 160 of the second embodiment.

Referring to FIG. 9, in the arrangement example 160, an address latch circuit 162 is provided closer to the address pad train 120.1, and an address latch circuit 164 is provided closer to the address pad train 120.2. The address latch circuits 162 and 164 are located at such positions that are symmetric with respect to the line X1.

The address latch circuits 162 and 164 are both located on the line X2 that extends perpendicularly to the line X1 through the middle point of the pad train 120.2 included in the address pad group.

A path for transmitting an address signal from each pad to the address latch circuit 164 will now be described. A path for transmitting the address bit A4 to the address latch circuit 164 through a corresponding pad and the first input stage 134 is made to have the same length as that of a path for transmitting the address bit A12 to the address latch circuit 164 through a corresponding pad and the first input stage 134. Similarly, a transmission path of the address bit A5 is made to have the same length as that of a transmission path of the address bit A11. Transmission paths of the address bits A6 and A7 are also made to have the same length as that of transmission paths of the address bits A9 and A8, respectively.

Arranging the address latch circuit 164 on the line X2 reduce the difference between the respective lengths of a plurality of input signal paths from the pad group 120.2 to the address latch circuit 164. Note that the difference between the respective lengths of a plurality of input signal paths from the pad group 120.1 to the address latch circuit 162 can also be reduced in the same manner as that of the paths from the pad group 120.2 to the address latch circuit 164.

The clock signal CLK is first transmitted through a first input stage 136 to a prescribed point on the line X1 that is located at an equal distance from the address latch circuits 162 and 164. From that point, the path is branched to the address latch circuits 162 and 164.

Note that, since each of the address latch circuits 162 and 164 has the same structure as that shown in FIG. 5, description thereof will not be repeated. In each of the address latch circuits 162 and 164, however, the number of address bits and the number of corresponding latch circuits are both reduced by half. An inverter for amplifying a clock near the latch circuits is included in each of the address latch circuits 162 and 164.

The relation between FIGS. 8 and 9 corresponds to the relation between FIGS. 4 and 7. The arrangement example of FIG. 9 can make the transmission path length of the signal INTA shorter than that of the arrangement example of FIG. 8, thereby further reducing variation in setup time and hold time among the address pads.

An advantage of the address-latch arrangement of the second embodiment is that, due to the reduced transmission path length of the signal INTA, the signal INTA is less subjected to noise and a buffer provided for each address pad for buffering the signal INTA can be reduced in size.

As has been described above, the address latch circuits each having the latches collectively located therein are provided for the respective pad trains and are arranged so as to have the same relation with the corresponding pad train. As a result, variation in setup time and hold time between the pad trains can be reduced. The address latch position may be shifted from the position near the address pad train to the position near the clock pad, as required. This allows for further reduced variation in setup time and hold time.

Third Embodiment

In the first embodiment, the arrangement example 140 of FIG. 7 seems to be advantageous over the arrangement example 130 of FIG. 4 in terms of the variation in setup time and hold time. This is because the difference in transmission path length of the signal INTA between the address bits is smaller in the arrangement example 140 of FIG. 7 than in the arrangement example 130 of FIG. 4.

This is true in the case where every interconnection for transmitting the signal INTA has the same parasitic resistance Rp and parasitic capacitance Cp per unit length, i.e., in the case where these interconnections are formed from the same material, with the same width and pitch. The same applies to the arrangement example 160 of FIG. 9 in the second embodiment.

Therefore, such a layout is possible that reduces the parasitic resistance and parasitic capacitance of an interconnection for transmitting the signal INTA from an address pad located away from an address latch.

Figure 10:
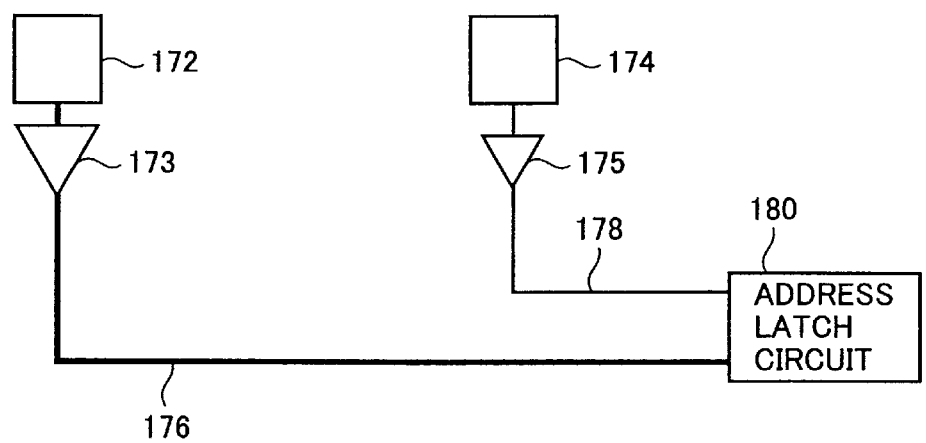
FIG. 10 is a diagram illustrating such a layout that reduces parasitic capacitance and parasitic resistance.

FIG. 10 is a diagram illustrating such a layout that reduces the parasitic capacitance and parasitic resistance.

Referring to FIG. 10, it is now assumed that a pad 174 is located close to an address latch circuit 180, and a pad 172 is located away from the address latch circuit 180. An address signal applied to the pad 172 is input to a buffer circuit 173 provided near the pad 172. The output of the buffer circuit 173 is transmitted to the address latch circuit 180 through an interconnection 176.

Similarly, an address signal applied to the pad 174 is input to a buffer circuit 175 provided near the pad 174. The output of the buffer circuit 175 is transmitted to the address latch circuit 180 through an interconnection 178.

The signal delay amount can be adjusted by devising the interconnections 176 and 178. Higher driving capability may also be provided to the buffer circuit 173 than to the buffer circuit 175 according to the interconnection path length. This is further effective in adjusting the delay amount.

Figure 11:
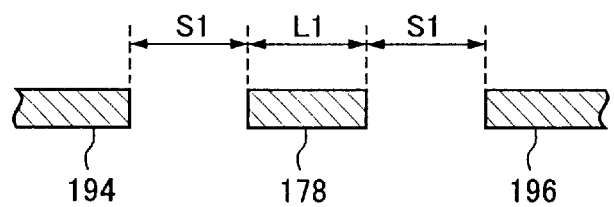
FIG. 11 is a diagram illustrating the cross section of an interconnection 178 in FIG. 10.

FIG. 11 is a diagram illustrating the cross section of the interconnection 178 of FIG. 10.

Figure 12:
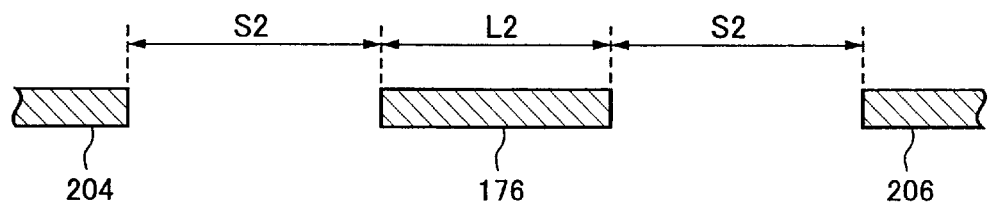
FIG. 12 is a diagram illustrating the cross section of an interconnection 176 in FIG. 10.
Figure 13:
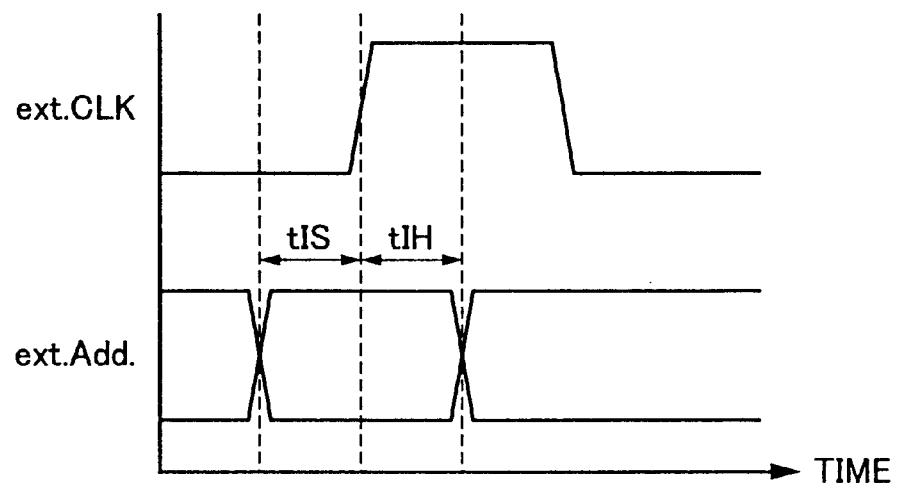
FIG. 13 is a timing chart showing the relation between an external clock ext.CLK and an external address ext.Add that are input to a conventional SDRAM.

FIG. 12 is a diagram illustrating the cross section of the interconnection 176 of FIG. 10.

Referring to FIGS. 11 and 12, the width L2 of the interconnection 176 is larger than the width L1 of the interconnection 178. Moreover, the space S2 between the interconnection 176 and an adjacent interconnection 204, 206 is larger than the space S1 between the interconnection 178 and an adjacent interconnection 194, 196.

In other words, a longer interconnection in FIG. 10 has a larger width so as to have smaller parasitic resistance Rp. As the interconnection width is increased, the amount of parasitic capacitance components Cps resulting from the upper and lower surfaces of the interconnection is increased, but the product of Rp and Cp is reduced due to the presence of side components Cpm of the parasitic capacitance Cp. As a result, the propagation delay is reduced.

As the design rules become minute due to a finer process, the ratio of the interconnection thickness to the interconnection width is increased, so that the side components of the parasitic capacitance become predominant. Accordingly, increasing the interconnection width is highly effective in reducing the delay amount. A plurality of interconnection layers may be intentionally combined to form an interconnection for transmitting the signal INTA. In this case, the utilization ratio of the interconnection layers may be varied according to the interconnection length in order to reduce the parasitic resistance Rp. For example, the following methods are possible to reduce the parasitic capacitance Cp: a longer transmission interconnection of the signal INTA is located at a larger distance to an adjacent interconnection, thereby reducing the amount of side components Cpm; and intentionally, no other interconnection is provided on the upper and lower surfaces of the transmission interconnection, thereby reducing the upper- and lower-surface components Cps.

Combining the above with the arrangement of the address latch circuit(s) of the first and second embodiments enables variation in setup time and hold time to be suppressed even when the path length to the address latch is different from address bit to address bit as in FIG. 4. It should be appreciated that this is also appreciable to the arrangement examples of FIGS. 7, 8 and 9.

Figure 14:
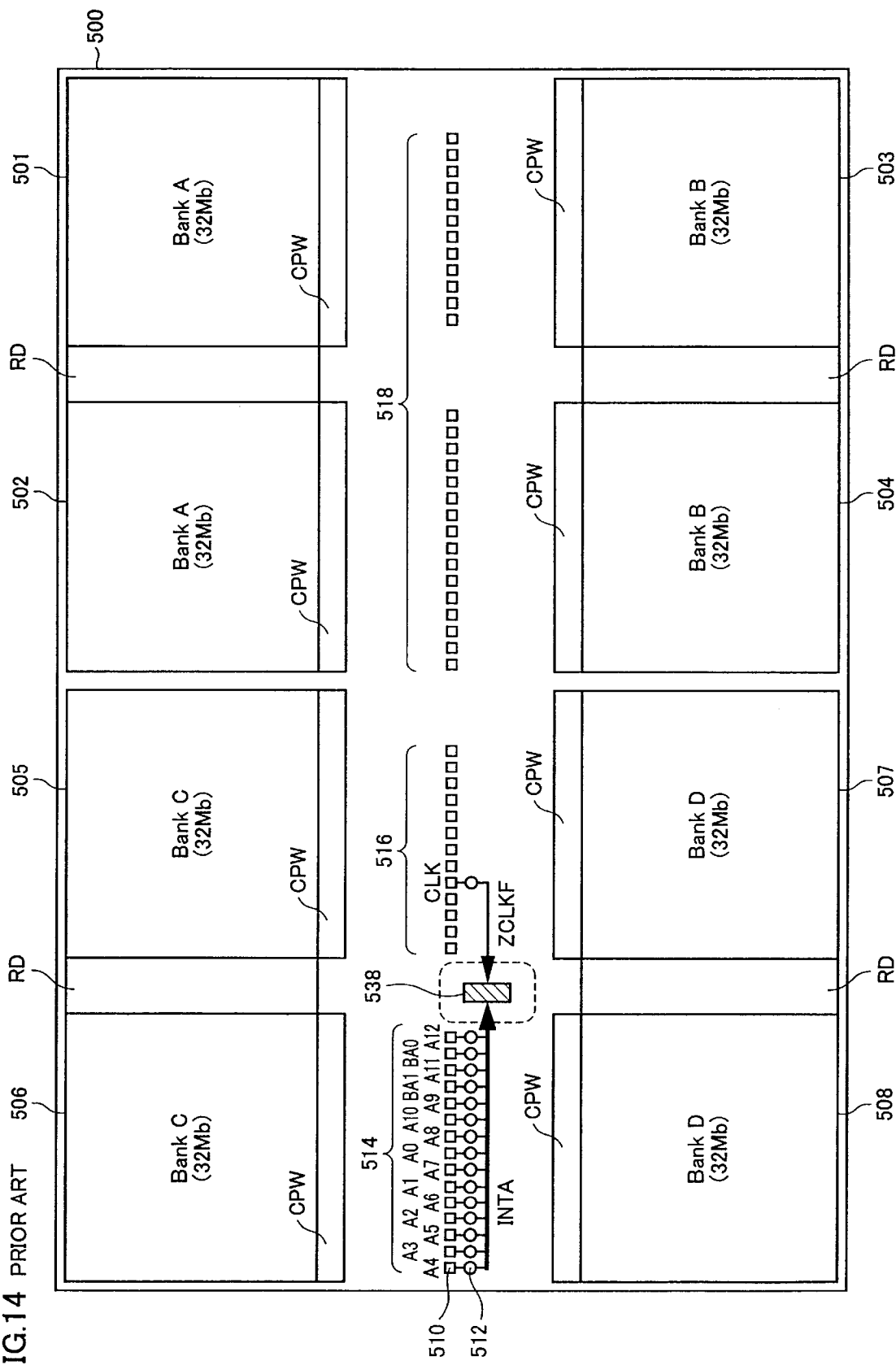
FIG. 14 is a diagram illustrating the pad arrangement and the memory array arrangement of a conventional general SDRAM.
Figure 15:
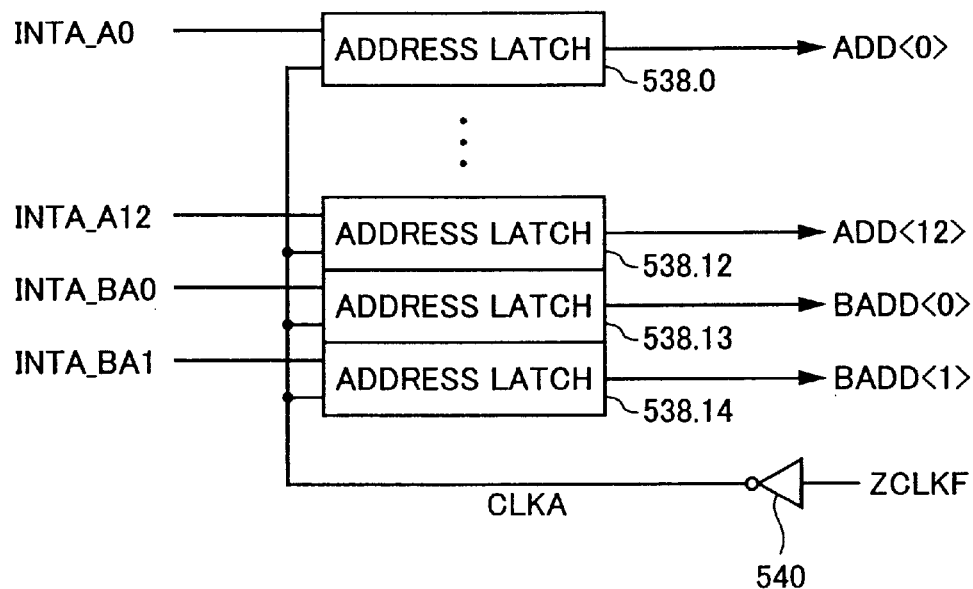
FIG. 15 is a diagram showing the structure of an address latch circuit 538 in FIG. 14.
Figure 16:
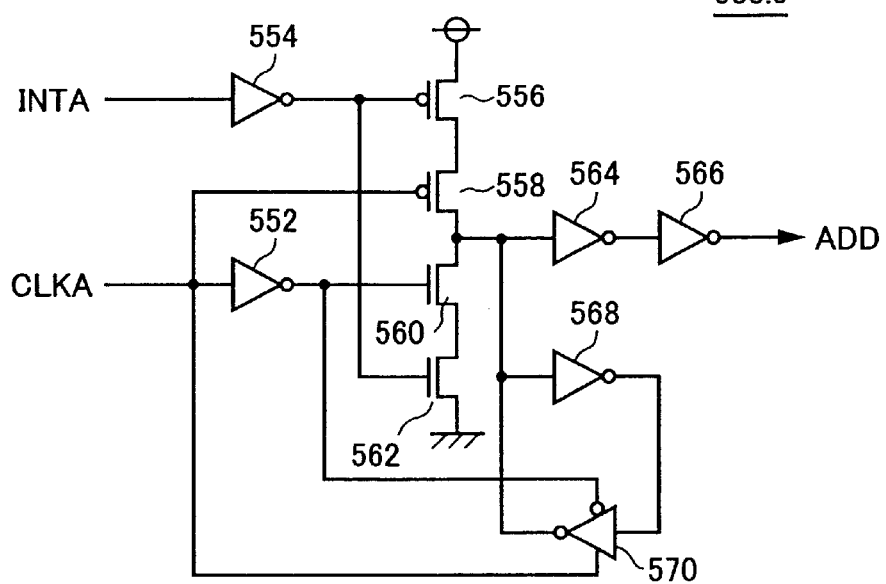
FIG. 16 is a circuit diagram showing the structure of an address latch 538.0 in FIG. 15.

The present invention as described in connection with FIGS. 10 to 12 is also applicable to the arrangement like the conventional example in which the pads are arranged in a single train. More specifically, in FIG. 14, an interconnection for transmitting a signal from a distant pad like the pad 510 receiving the address bit A4 to the address latch circuit 538 is made to have a large width and space like the interconnection 176 of FIG. 10. On the other hand, an interconnection for transmitting a signal from a nearby pad like the pad 510 receiving the address bit A12 to the address latch circuit 538 is made to have a small width and space like the interconnection 178 of FIG. 10. This enables variation in setup time and hold time to be suppressed.

The driving capability of the buffer for driving the signal INTA may also be made different from address pad to address pad. It is more effective to combine this with the arrangement of the address latch circuit(s) of the first and second embodiments. For example, in the case of FIGS. 4 and 8, the path of the address bit A4 to the address latch circuit 138, 154 is the longest. Therefore, the buffer size included in the first input stage 134 is made largest for the address bit A4, and is gradually reduced in the order of the address bits A5, A6, A7, A8, A9 and A11. The buffer size is made smallest for the address bit A12. This is advantageous in averaging the delay resulting from a blunt input waveform.

As has been described above, even when the distance from the address pad to the address latch is different from address bit to address bit, the interconnection layout of the transmission paths is optimized on an address-by-address basis, whereby variation in setup time and hold time among addresses can be reduced.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device formed in a memory region of a main surface of a semiconductor substrate, comprising:
    a plurality of terminal groups provided in a central region of said memory region for receiving respective allocated portions of an external address signal;
    a clock terminal provided in said central region, for receiving an external clock signal;
    an address latch circuit provided in said central region at a substantially equal distance from said plurality of terminal groups, for latching said address signal according to said clock signal; and
    a plurality of memory blocks provided in a peripheral region surrounding said central region in said memory region, for receiving and outputting data according to an output of said address latch circuit.

2. The semiconductor memory device according to claim 1, wherein
    said plurality of terminal groups includes a first terminal group arranged along a first line, and a second terminal group arranged along a second line that is in parallel with said first line, and
    said address latch circuit is provided on a third line that is in parallel with, and is located at an equal distance from, said first and second lines.

3. The semiconductor memory device according to claim 2, wherein said second terminal group includes a plurality of second terminals respectively located at such positions that are symmetric to a plurality of first terminals included in said first terminal group with respect to said third line,
    said semiconductor memory device further comprising:
        a plurality of first input buffer circuits respectively connected to said plurality of first terminals, for amplifying an input signal from the corresponding terminal;
        a plurality of first interconnections for transmitting respective outputs of said plurality of first input buffer circuits to said address latch circuit;
        a plurality of second input buffer circuits respectively located at such positions that are symmetric to said plurality of first input buffer circuits with respect to said third line and respectively connected to said plurality of second terminals, for amplifying an input signal from the corresponding terminal; and
        a plurality of second interconnections respectively located in such paths that are symmetric to paths of said plurality of first interconnections with respect to said third line, for transmitting respective outputs of said plurality of second input buffer circuits to said address latch circuit.

4. The semiconductor memory device according to claim 2, wherein said address latch circuit is located on said third line so as to have a shortest distance to said clock terminal.

5. The semiconductor memory device according to claim 2, wherein said address latch circuit is located on said third line such that a plurality of signal transmission paths from said first terminal group to said address latch circuit have a shortest average length.

6. The semiconductor memory device according to claim 1, wherein said address latch circuit includes
    a plurality of latch circuits for receiving a plurality of bits of said address signal, respectively, and
    a clock buffer circuit located near the plurality of latch circuits, for amplifying an internal clock signal applied through said clock terminal so as to apply the amplified internal clock signal to said plurality of latch circuits.

7. The semiconductor memory device according to claim 1, further comprising a plurality of interconnections respectively provided on a plurality of paths for transmitting the corresponding address bit from said terminal group to said address latch circuit, wherein each of said plurality of interconnections has its width and its space to an adjacent interconnection determined according to a path length from the corresponding terminal to said address latch circuit.

8. The semiconductor memory device according to claim 1, further comprising a plurality of input buffers respectively provided on a plurality of paths for transmitting the corresponding address bit from said terminal group to said address latch circuit, wherein driving capability of each of said input buffers is determined according to a path length from the corresponding terminal to said address latch circuit.

9. A semiconductor memory device formed in a memory region of a main surface of a semiconductor substrate, comprising:
    a plurality of terminal groups provided in a central region of said memory region for receiving respective allocated portions of an external address signal;
    a clock terminal provided in said central region, for receiving an external clock signal;
    a plurality of address latch circuits each provided in said central region at a substantially equal distance from said plurality of terminal groups, for latching said address signal according to said clock signal; and
    a plurality of memory blocks provided in a peripheral region surrounding said central region in said memory region, for receiving and outputting data according to respective outputs of said plurality of address latch circuits.

10. The semiconductor memory device according to claim 9, wherein
    said plurality of terminal groups includes a first terminal group arranged along a first line, and a second terminal group arranged along a second line that is in parallel with said first line, and said plurality of address latch circuits includes a first address latch circuit provided on a third line that is in parallel with, and is located at a prescribed distance from, said first line, and a second address latch circuit provided on a fourth line that is in parallel with, and is located at said prescribed distance from, said first line.

11. The semiconductor memory device according to claim 10, wherein said second address latch circuit is located at such a position that is symmetric to said first address latch circuit with respect to a fifth line located at an equal distance from said first and second lines, and said second terminal group includes a plurality of second terminals respectively located at such positions that are symmetric to a plurality of first terminals included in said first terminal group with respect to said fifth line, said semiconductor memory device further comprising:

a plurality of first input buffer circuits respectively connected to said plurality of first terminals, for amplifying an input signal from the corresponding terminal;

a plurality of first interconnections for transmitting respective outputs of said plurality of first input buffer circuits to said first address latch circuit;

a plurality of second input buffer circuits respectively located at such positions that are symmetric to said plurality of first input buffer circuits with respect to said fifth line, and respectively connected to said plurality of second terminals, for amplifying an input signal from the corresponding terminal; and a plurality of second interconnections respectively located in such paths that are symmetric to paths of said plurality of first interconnections with respect to said fifth line, for transmitting respective outputs of said plurality of second input buffer circuits to said second address latch circuit.

12. The semiconductor memory device according to claim 10, wherein a first length of a path for transmitting the clock signal from said clock terminal to said first address latch circuit is equal to a second length of a path for transmitting said clock signal from said clock terminal to said second address latch circuit, and said first and second address latch circuits are provided such that a sum of said first and second lengths on said third and fourth lines is minimized.

13. The semiconductor memory device according to claim 10, wherein said first address latch circuit is located such that an average length of a plurality of signal transmission paths from said first terminal group to said first address latch circuit on said third line is minimized.

14. The semiconductor memory device according to claim 9, wherein each of said plurality of address latch circuits includes a plurality of latch circuits for receiving respective bits allocated to the corresponding terminal group out of the plurality of bits of said address signal, and a clock buffer circuit provided near said plurality of latch circuits, for amplifying an internal clock signal applied through said clock terminal so as to apply the amplified internal clock signal to said plurality of latch circuits.

15. The semiconductor memory device according to claim 9, further comprising a plurality of interconnection groups respectively provided on a plurality of paths for transmitting the corresponding address bit from the corresponding terminal group to the address latch circuit corresponding to the terminal group, wherein each of said plurality of interconnection groups has its each width and its each space to an adjacent interconnection determined according to a path length from the corresponding terminal to the corresponding address latch circuit.

16. The semiconductor memory device according to claim 9, further comprising a plurality of input buffers respectively provided on a plurality of paths for transmitting the corresponding address bit from the corresponding terminal group to the address latch circuit corresponding the terminal group, wherein driving capability of each of said input buffers is determined according to a path length from the corresponding terminal to the corresponding address latch circuit.

* * * * *